United States Patent
Kim et al.

(10) Patent No.: US 9,958,523 B2
(45) Date of Patent: *May 1, 2018

(54) MAGNETIC RESONANCE IMAGING SYSTEM USING SUB-VOLUMES AND MAGNETIC RESONANCE IMAGING METHOD USING SUB-VOLUMES

(71) Applicant: Samsung Electronics Co., Ltd., Suwon-si (KR)

(72) Inventors: Young Beom Kim, Yongin-si (KR); Yeunchul Ryu, Hwaseong-si (KR); Jaemock Yi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 763 days.

This patent is subject to a terminal disclaimer.

(21) Appl. No.: 14/079,199

(22) Filed: Nov. 13, 2013

(65) Prior Publication Data
US 2014/0132264 A1 May 15, 2014

(30) Foreign Application Priority Data
Nov. 14, 2012 (KR) .................. 10-2012-0129093

(51) Int. Cl.
*G01V 3/00* (2006.01)
*G01R 33/483* (2006.01)
*G01R 33/48* (2006.01)
*G01R 33/561* (2006.01)

(52) U.S. Cl.
CPC ...... *G01R 33/4835* (2013.01); *G01R 33/4822* (2013.01); *G01R 33/4826* (2013.01); *G01R 33/5611* (2013.01)

(58) Field of Classification Search
CPC ........... G01R 33/4835; G01R 33/4822; G01R 33/4826; G01R 33/5611
USPC ........................................... 324/309
See application file for complete search history.

(56) References Cited

U.S. PATENT DOCUMENTS

| 5,446,384 A | 8/1995 | Dumoulin |
| 6,043,654 A | 3/2000 | Liu et al. |
| 6,879,158 B2* | 4/2005 | Zhu ................... G01R 33/3415 324/309 |

(Continued)

FOREIGN PATENT DOCUMENTS

| KR | 2002-0071022 A | 9/2002 |
| KR | 10-2006-0049365 A | 5/2006 |

(Continued)

*Primary Examiner* — Susan Lee
(74) *Attorney, Agent, or Firm* — NSIP Law

(57) ABSTRACT

A magnetic resonance imaging (MRI) method includes: applying radio-frequency (RF) pulses comprising a plurality of frequency components and a selection gradient to a subject to simultaneously excite a plurality of sub-volumes in each of a plurality of groups, wherein a plurality of sub-volumes making up a volume of the subject are divided into the plurality of groups so that any neighboring sub-volumes belong to different groups; performing three-dimensional (3D) encoding on each of the excited sub-volumes using a plurality of encoding methods; acquiring magnetic resonance signals from the encoded sub-volumes; and reconstructing the acquired magnetic resonance signals into image data corresponding to each of the encoded sub-volumes.

22 Claims, 9 Drawing Sheets

(56) References Cited

U.S. PATENT DOCUMENTS

| | | | |
|---|---|---|---|
| 6,914,432 B2 * | 7/2005 | Dumoulin | G01R 33/3415 324/318 |
| 7,242,193 B2 * | 7/2007 | Feiweier | G01R 33/3607 324/318 |
| 8,299,793 B2 * | 10/2012 | Riederer | G01R 33/34046 324/318 |
| 8,738,113 B2 * | 5/2014 | Parker | G01R 33/5617 600/413 |
| 2001/0018558 A1 * | 8/2001 | Suzuki | G01R 33/4835 600/410 |
| 2003/0001568 A1 | 1/2003 | Edwards | |
| 2005/0251022 A1 * | 11/2005 | Harvey | G01R 33/54 600/410 |
| 2007/0206848 A1 | 9/2007 | Ohishi | |
| 2009/0072827 A1 * | 3/2009 | Hargreaves | G01R 33/4822 324/309 |
| 2011/0006765 A1 * | 1/2011 | Zhao | G01R 33/4826 324/307 |
| 2011/0144474 A1 | 6/2011 | Ouwerkerk | |
| 2012/0056620 A1 | 3/2012 | Feinberg et al. | |
| 2012/0068704 A1 * | 3/2012 | Popescu | G01R 33/5611 324/309 |
| 2012/0081116 A1 | 4/2012 | Takai | |
| 2012/0235682 A1 * | 9/2012 | Chen | G01R 33/4835 324/309 |
| 2013/0342206 A1 * | 12/2013 | Ugurbil | G01R 33/4835 324/309 |
| 2014/0111201 A1 | 4/2014 | Kim et al. | |

FOREIGN PATENT DOCUMENTS

| | | |
|---|---|---|
| KR | 10-2007-0119981 A | 12/2007 |
| KR | 10-2014-0051749 A | 5/2014 |

\* cited by examiner

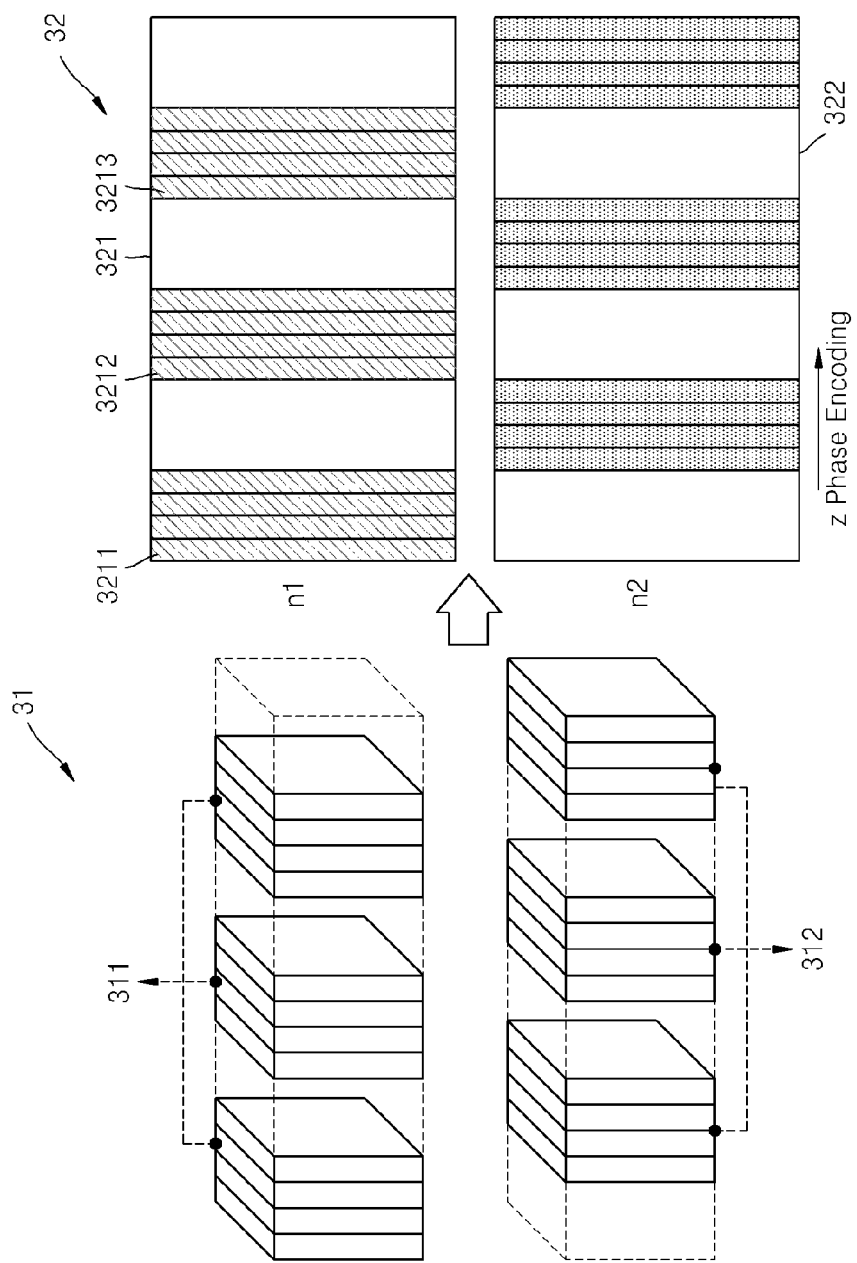

MAGNETIC RESONANCE IMAGING SYSTEM USING SUB-VOLUMES AND MAGNETIC RESONANCE IMAGING METHOD USING SUB-VOLUMES

CROSS-REFERENCE TO RELATED APPLICATIONS

This application claims the benefit of Korean Patent Application No. 10-2012-0129093 filed on Nov. 14, 2012, in the Korean Intellectual Property Office, the disclosure of which is incorporated herein by reference in its entirety for all purposes.

BACKGROUND

1. Field

This application relates to magnetic resonance imaging (MRI) systems and magnetic resonance imaging methods.

2. Description of Related Art

Magnetic resonance imaging (MRI) uses magnetic fields produced by magnetism to acquire images of biological tissues in a human body. An MRI system applies a radio-frequency (RF) signal to biological tissues, thereby causing the biological tissues to resonate. The MRI system also applies a magnetic gradient to biological tissues to obtain spatial information about the biological tissues.

SUMMARY

In one general aspect, a magnetic resonance imaging (MRI) method includes applying radio-frequency (RF) pulses including a plurality of frequency components and a selection gradient to a subject to simultaneously excite a plurality of sub-volumes in each of a plurality of groups, wherein a plurality of sub-volumes making up a volume of the subject are divided into the plurality of groups so that any neighboring sub-volumes belong to different groups; performing three-dimensional (3D) encoding on each of the excited sub-volumes using a plurality of encoding methods; acquiring magnetic resonance signals from the encoded sub-volumes; and reconstructing the acquired magnetic resonance signals into image data corresponding to each of the encoded sub-volumes.

The performing of the 3D encoding may include performing a first encoding method in a first direction and a second direction on each of the excited sub-volumes; and performing a second encoding method in a third direction on each of the excited sub-volumes.

The first encoding method may include radial encoding or spiral encoding; and the second encoding method may include Cartesian encoding.

The plurality of groups may include a first group through an N-th group, the plurality of sub-volumes making up the volume of the subject may be sequentially and cyclically distributed to the first group through the N-th group, and N may be an integer greater than or equal to 2.

The reconstructing of the acquired magnetic resonance signals may include reconstructing the acquired magnetic resonance signals into the image data corresponding to each of the encoded sub-volumes using a parallel imaging algorithm that takes into consideration channel information of multi-channel receiver coils configured to acquire the magnetic resonance signals.

The method may further include performing the applying of the RF pulses and the selection gradient to the subject, the performing of the 3D encoding on each of the excited sub-volumes, the acquiring of the magnetic resonance signals from the encoded sub-volumes, and the reconstructing of the acquired magnetic resonance signals into image data for all of the plurality of groups to obtain reconstructed image data for all of the plurality of groups; and synthesizing the reconstructed image data for all of the plurality of groups.

In another general aspect, a non-transitory computer-readable storage medium stores a program for controlling a computer to perform the method described above.

In another general aspect, a magnetic resonance imaging (MRI) method includes applying a predetermined pulse sequence that performs a plurality of encoding methods to a subject; reconstructing image data corresponding to each of a plurality of sub-volumes of one of a plurality of groups, wherein a plurality of sub-volumes making up a volume of the subject are divided into the plurality of groups so that any neighboring sub-volumes belong to different groups; determining whether the applying of the predetermined pulse sequence and the reconstructing of the image data has been performed for all of the plurality of groups; in response to a determination that the applying of the predetermined pulse sequence and the reconstructing of the image data have not been performed for all of the plurality of groups, applying the predetermined pulse sequence and performing the reconstructing of the image data for a next one of the plurality of groups; and in response to a determination that the applying of the predetermined pulse sequence and the reconstructing of the image data have been performed for all of the plurality of groups, combining image data corresponding to each of the plurality of sub-volumes of each of the plurality of groups to create a three-dimensional (3D) volume image of the subject.

The method may further include applying a selection gradient to the subject together with the predetermined pulse sequence; the predetermined pulse sequence may include a first encoding gradient for performing phase encoding with a first trajectory in a first direction; a frequency encoding gradient for performing frequency encoding with the first trajectory in a second direction; and a second encoding gradient for performing slice encoding with a second trajectory in a third direction; and the third direction may be a same direction as a direction in which the selection gradient is applied.

The first trajectory may include a radial trajectory or a spiral trajectory; and the second trajectory may include a Cartesian trajectory.

The plurality of groups may include a first group through an N-th group, the plurality of sub-volumes making up the volume of the subject may be sequentially and cyclically distributed to the first group through the N-th group, and N may be an integer greater than or equal to 2.

In another general aspect, a non-transitory computer-readable storage medium stores a program for controlling a computer to perform the method described above.

In another general aspect, a magnetic resonance imaging (MRI) system includes an MRI scanner configured to apply radio-frequency (RF) pulses including a plurality of frequency components and a selection gradient to a subject to simultaneously excite a plurality of sub-volumes in each of a plurality of groups, wherein a plurality of sub-volumes making up a volume of the subject are divided into the plurality of groups so that any neighboring sub-volumes belong to different groups; perform three-dimensional (3D) encoding on each of the excited sub-volumes using a plurality of encoding methods; and acquire magnetic resonance signals from the encoded sub-volumes; and a data processor configured to reconstruct the acquired magnetic resonance signals into image data corresponding to each of the encoded sub-volumes.

The MRI scanner may be further configured to perform the 3D encoding by performing a first encoding method in a first direction and a second direction on each of the excited sub-volumes; and performing a second encoding method in a third direction on each of the excited sub-volumes.

The first encoding method may include radial encoding or spiral encoding; and the second encoding method may include Cartesian encoding.

The plurality of groups may include a first group through an N-th group, the plurality of sub-volumes making up the volume of the subject may be sequentially and cyclically distributed to the first group through the N-th group, and N may be an integer greater than or equal to 2.

The MRI scanner may include gradient coils configured to apply the selection gradient to the subject and perform the 3D encoding on each of the excited sub-volumes by applying to the subject a first encoding gradient in a first direction for performing phase encoding with a radial trajectory or a spiral trajectory; a frequency encoding gradient in a second direction for performing frequency encoding with the radial trajectory or the spiral trajectory; and a second encoding gradient in a third direction for performing slice encoding with a Cartesian trajectory; and the third direction may be a same direction as a direction in which the selection gradient is applied.

The MRI scanner may include RF coils configured to acquire the magnetic resonance signals from the encoded sub-volumes; the data processor may include a reconstructor configured to produce k-spaces from the magnetic resonance signals acquired by the RF coils, and reconstruct image data generated from the k-spaces into image data corresponding to each of the encoded sub-volumes; and each of the k-spaces may include radial data filling a plane defined by a first direction and a second direction of each of the k-spaces.

The MRI scanner may include multi-channel receiver coils configured to acquire the magnetic resonance signals from the encoded sub-volumes; and the data processor may be further configured to reconstruct the acquired magnetic resonance signals into the image data corresponding to each of the encoded sub-volumes using a parallel imaging algorithm that takes into consideration channel information of the multi-channel receiver coils.

The data processor may include a reconstructor configured to reconstruct the acquired magnetic resonance signals into image data corresponding to each of the plurality of sub-volumes in each of the plurality of groups to obtain reconstructed image data for all of the plurality of groups; and a synthesizer configured to synthesize the reconstructed image data for all of the plurality of groups.

In another general aspect, a magnetic resonance imaging (MRI) method includes simultaneously exciting a plurality of sub-volumes of a subject, the excited sub-volumes being separated from one another by other sub-volumes of the subject that are not excited; performing three-dimensional (3D) encoding on each of the excited sub-volumes using a plurality of encoding methods; acquiring magnetic resonance image signals from the encoded sub-volumes; and reconstructing the acquired magnetic resonance signals into image data corresponding to each of the encoded sub-volumes.

The method may further include performing the exciting, encoding, acquiring, and reconstructing on another plurality of sub-volumes of the subject selected from the sub-volumes that were not excited until the performing the exciting, encoding, acquiring, and reconstructing have been performed on all of the sub-volumes of the subject.

The encoding methods may include a plurality of encoding methods having different trajectories.

The encoding methods may include a plurality of encoding methods having different sensitivities to a motion of the subject.

The encoding methods may include a plurality of encoding methods producing k-space data having a plurality of different distributions.

Other features and aspects will be apparent from the following detailed description, the drawings, and the claims.

BRIEF DESCRIPTION OF THE DRAWINGS

FIG. 3 illustrates an example of a multi-volume imaging technique for each of a plurality of groups.

DETAILED DESCRIPTION

Figure 1:
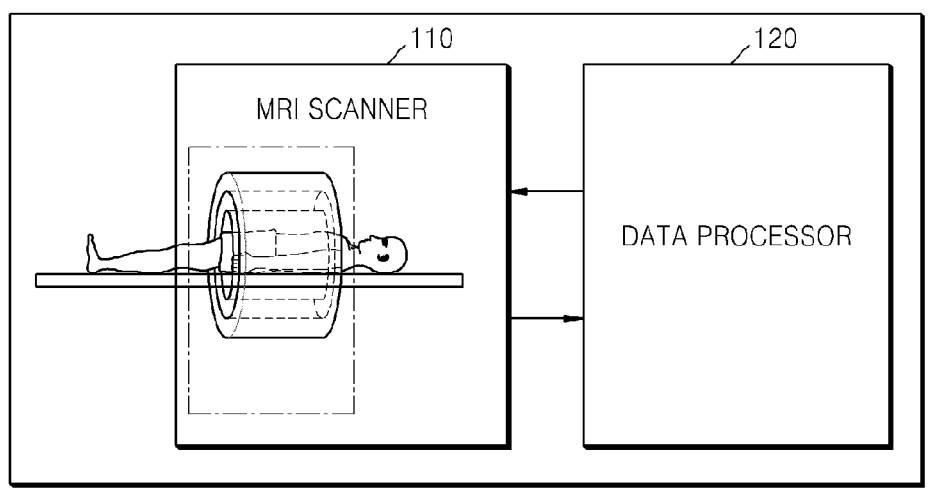
FIG. 1 illustrates an example of a magnetic resonance imaging (MRI) system.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, description of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

FIG. 1 illustrates an example of a magnetic resonance imaging (MRI) system 100. Referring to FIG. 1, the MRI system 100 includes an MRI scanner 110 and a data processor 120.

Although the MRI system 100 of FIG. 1 only includes components related to this example, it will be apparent to one of ordinary skill in the art that the MRI system 100 may further include other common components.

The MRI system 100 non-invasively acquires images containing information about biological tissues of a subject. For example, the MRI system 100 may be a device that utilizes a magnetic field produced by magnetism to obtain diagnostic images of a subject, but is not limited thereto. Examples of the subject may include a human body, brain, spine, heart, liver, and fetus, but are not limited thereto. The MRI system 100 may also be a hybrid MRI system combined with another medical equipment, such as a positron emission tomography (PET) device.

The MRI scanner 110 acquires magnetic resonance signals from a plurality of sub-volumes that make up a volume of the subject. Each of the plurality of sub-volumes may include a predetermined number of slices. The number of slices may be determined automatically according to the properties of the subject and a usage environment, or manually by a user. Likewise, a thickness of slices may be determined automatically according to the properties of the subject and a usage environment, or manually by a user.

For example, the MRI scanner 110 may apply radio-frequency (RF) pulses including a plurality of frequency components and a selection gradient to the subject to simultaneously excite sub-volumes in each of at least two groups, wherein the plurality of sub-volumes are divided into the at least two groups so that any neighboring sub-volumes belong to different groups. The MRI scanner 110 then performs three-dimensional (3D) encoding on each of the excited sub-volumes using at least two encoding methods and, acquires magnetic resonance signals from the plurality of sub-volumes.

More specifically, when the MRI scanner 110 applies RF pulses containing a plurality of frequency components and a selection gradient to a subject lying in a static magnetic field, a plurality of sub-volumes in each of at least two groups are simultaneously excited. The sub-volumes are divided into the at least two groups so that any neighboring sub-volumes belong to different groups. When the at least two groups include a first group through an N-th group, the plurality of sub-volumes in the volume of the subject are sequentially and cyclically distributed to one of the first through N-th groups. N is an integer that is equal to or greater than 2. For example, if the plurality of sub-volumes include first through S-th sub-volumes, the plurality of sub-volumes may be sequentially and cyclically included in the first through N-th groups. The first sub-volume and the second sub-volume may be in the first and second groups, respectively. In this way, the N-th sub-volume may be in the N-th group. The N+1-th, N+2-th, and 2N-th sub-volumes are respectively distributed to the first, second, and N-th groups in a cyclic fashion. By doing so, each of the first through S-th sub-volumes may be grouped in a way such that any neighboring sub-volumes belong to different groups.

The first through S-th sub-volumes in the subject may be sequentially defined based on a predetermined direction. For example, based on a direction in which a selection gradient is applied to the subject, the first and last sub-volumes may be set to the first and S-th sub-volumes, respectively. When a volume of the subject is defined with respect to x, y, and z-axes, the direction in which the selection gradient is applied may be a z-axis, but is not limited thereto. For example, the x-axis may represent a direction of a sagittal plane or a coronal plane, and the z-axis may represent a direction of an axial plane or a transverse plane, or a slice direction.

Figure 2A:
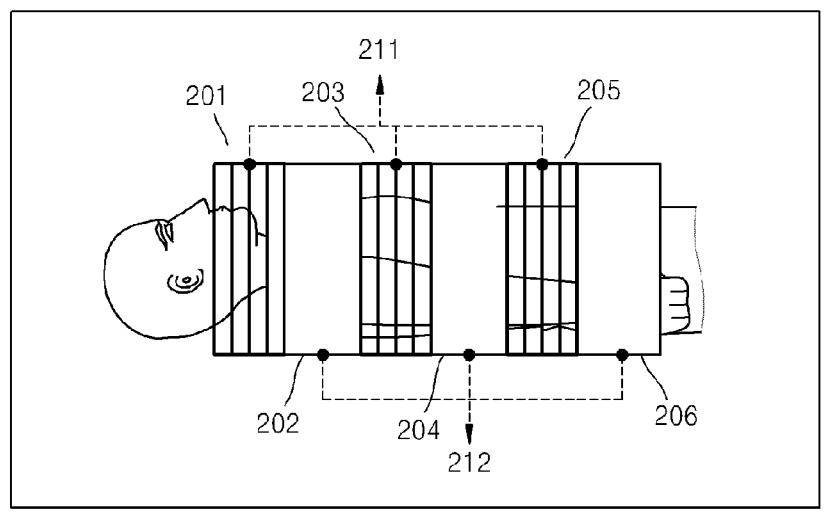
FIGS. 2A and 2B illustrate examples of a method of grouping a plurality of sub-volumes.
Figure 2B:
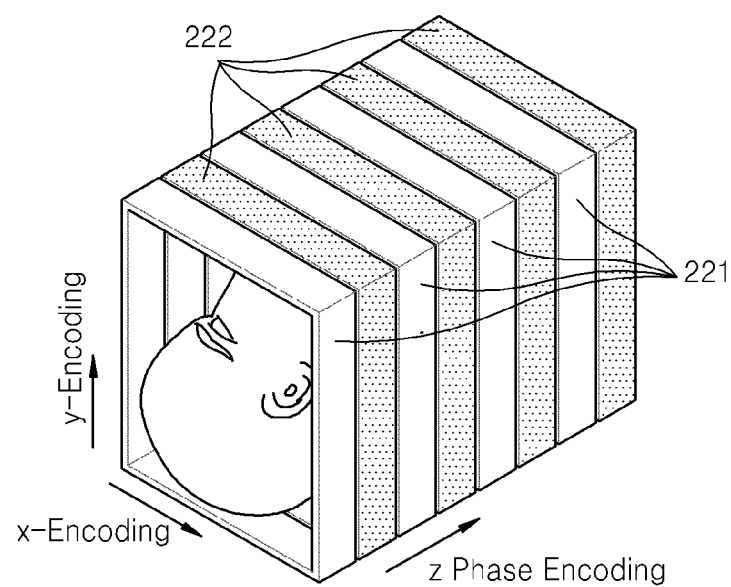

FIGS. 2A and 2B illustrate examples of a method of grouping a plurality of sub-volumes. Examples of a plurality of sub-volumes defined using slices in a volume of a subject and at least two groups created by dividing the plurality of sub-volumes so that adjacent sub-volumes are in different groups will now be described with reference to FIGS. 2A and 2B.

Referring to FIGS. 2A and 2B, the MRI scanner 110 applies RF pulses containing a plurality of frequency components and a selection gradient to a subject to simultaneously excite a plurality of sub-volumes in a first one of at least two groups.

For example, when M sub-volumes are simultaneously excited, the applied RF pulses may be multi-band RF pulses generated by modulating a single volume selective RF pulse into M RF pulses.

As another example, the applied RF pulses may be spatial encoding RF pulses generated by a Hadamard encoding or a phase-offset multiplanar volume imaging technique that excites designated M sub-volumes.

Thus, each of the RF pulses may have a frequency offset, and the RF pulses may be defined by the following Equation 1.

$$\Psi(t) = A \Sigma_m \sin c(\gamma G D t) e^{e^{\gamma G d(m) t}} e^{j\varphi(m)} \quad (1)$$

In Equation 1, $\Psi(t)$ denotes RF pulses, A denotes a constant, m denotes an m-th sub-volume of the M sub-volumes, $\gamma$ denotes a gyromagnetic ratio, G denotes a gradient, D denotes a thickness of sub-volumes, d(m) denotes a position of the m-th sub-volume, $\varphi(m)$ denotes a phase of the m-th sub-volume, and t denotes time.

For example, gradient G may be about 1 kHz/cm, but is not limited thereto. The RF pulses may be frequency modulated to have a frequency offset.

To realize a frequency offset, for example, the MRI scanner 110 may apply RF pulses containing frequency components corresponding to Larmor frequencies of sub-volumes in a first group to a subject located in a static magnetic field while applying a selection gradient to the subject with respect to a predetermined axial direction.

A Larmor frequency refers to a precession frequency of a magnetic moment of atomic nuclei. Atomic nuclei possess magnetic moments or magnetic dipole moments due to their spin. In the absence of an external magnetic field, atoms have magnetic moments that line up in random directions. Conversely, when atoms are placed in a static magnetic field, atomic nuclei align with the static magnetic field, thereby transiting to a lower energy state. As the atomic nuclei spin, their magnetic moments undergo precessional motion at a frequency called Larmor frequency. For example, the Larmor frequency may be determined by a product of a gyromagnetic ratio with a strength of an externally applied magnetic field.

The MRI scanner 110 applies a selection gradient to the subject lying in a static magnetic field to distribute a magnetic field whose intensity varies linearly in a predetermined direction. The MRI scanner 110 also applies to the subject RF pulses containing frequency components corresponding to Larmor frequencies of a plurality of sub-volumes to simultaneously excite the plurality of sub-volumes in the first group.

The MRI scanner 110 applies gradient to the subject to perform 3D encoding on each of the plurality of sub-volumes that are excited upon application of the RF pulses and the selection gradient using at least two encoding methods. For example, the MRI scanner 110 may perform a first encoding method in first and second directions, and a second encoding method in a third direction. The first and second directions may be x- and y-axis directions, respectively, and the third direction may be a z-axis direction. However, directions are not limited thereto. The first direction may be one of x-, y-, and z-axis directions. The second direction may be one of x-, y-, and z-axis directions, which is different from the first direction. The third direction may be one of x-, y-, and z-axis directions, which is different from the first and second directions.

The first encoding method may include radial encoding or spiral encoding, and the second encoding method may include Cartesian encoding, but the first and second encodings are not limited thereto. The radial encoding, the spiral encoding, and the Cartesian encoding may use a radial trajectory, a spiral trajectory, and a Cartesian trajectory, respectively, but are not limited thereto.

For example, the MRI scanner 110 may perform 3D encoding by applying to the subject a first encoding gradient in a first direction for phase encoding with a radial or spiral trajectory, a frequency encoding gradient in a second direction for frequency encoding with a radial or spiral trajectory, and a second encoding gradient in a third direction for slice encoding or slice direction encoding with a Cartesian trajectory. The third direction may be the same as the direction in which the selection gradient is applied. The second encoding gradient may also be a Cartesian linear gradient.

More specifically, the first encoding gradient, the frequency encoding gradient, and the second encoding gradient may be applied to the subject to provide information about locations in y-, x-, and z-axis directions, respectively. The first and second encoding gradients are then used to perform phase encoding in the y-axis direction and slice encoding in the z-axis direction, respectively. Slice encoding in the z-axis direction will be described in greater detail below with reference to FIG. 3.

Upon application of the frequency encoding gradient to the subject, the MRI scanner 110 may also read out magnetic resonance signals from the plurality of sub-volumes. The frequency encoding gradient may be a readout gradient. For example, the MRI scanner 110 may apply a readout gradient to the subject to sample magnetic resonance signals. A gradient may not be applied in the direction in which a selection gradient is applied during the application of the readout gradient to the subject, but this example is not limited thereto. While the selection gradient is being applied in the z-axis direction, the readout gradient may be applied in an x-axis direction.

The MRI scanner 110 performs 3D encoding on each of the excited plurality of sub-volumes using at least two encoding methods, and acquires magnetic resonance signals from the plurality of sub-volumes. The plurality of sub-volumes may be sub-volumes in the first group that are excited by RF pulses or a selection gradient. For example, the MRI scanner 110 may use multi-channel receiver coils to acquire magnetic resonance signals. The magnetic resonance signals may be obtained using the readout gradient.

The data processor 120 reconstructs the magnetic resonance signals acquired from the MRI scanner 110 into image data corresponding to each of the plurality of sub-volumes. More specifically, the data processor 120 produces k-spaces corresponding to multi-channel receiver coils using the magnetic resonance signals, generates image data corresponding to each of the multi-channel receiver coils from the k-spaces, and reconstructs image data corresponding to each of the plurality of sub-volumes using the image data corresponding to each of the multi-channel receiver coils. The k-space will be described in greater detail below with reference to FIGS. 4A and 4B.

For example, the data processor 120 may use a parallel imaging algorithm that takes into consideration channel information of multi-channel receiver coils to reconstruct magnetic resonance signals into image data. The channel information may represent the coil sensitivity of each of the multi-channel receiver coils. The data processor 120 is not limited thereto, and the data processor 120 may use a parallel imaging algorithm using information about current elements of an RF coil to reconstruct magnetic resonance signals into image data.

More specifically, since simultaneous excitation of the plurality of sub-volumes causes aliasing artifacts to occur, the MRI signals from each of the multi-channel receiver coils have information about a plurality of sub-volumes superimposed on each other. Thus, the data processor 120 uses a parallel imaging algorithm that takes into consideration channel information of the multi-channel receiver coils to separate the superimposed information and reconstruct image data corresponding to each of the plurality of sub-volumes. The parallel imaging algorithm may include Sensitivity Encoding (SENSE), Generalized Autocalibrating Partially Parallel Acquisitions (GRAPPA), Simultaneous Acquisition of Spatial Harmonics (SMASH), and Partially Parallel Imaging with Localized Sensitivities (PILS).

The data processor 120 uses de-aliasing in the parallel imaging algorithm and channel information of the multi-channel receiver coils to separate magnetic resonance signals having information about the plurality of sub-volumes superimposed on each other and reconstruct image data corresponding to each of the plurality of sub-volumes.

The MRI system 100 allows simultaneous excitation of a plurality of sub-volumes in a first one of at least two groups created by dividing the plurality of sub-volumes so that adjacent sub-volumes are in different groups, thereby providing a high-speed MRI scan and delivering high resolution 3D volume images at a high signal-to-noise ratio (SNR).

FIGS. 2A and 2B illustrate examples of a method of grouping a plurality of sub-volumes. While for convenience of explanation, FIGS. 2A and 2B show that the plurality of sub-volumes in a volume of the subject are partitioned into two groups so that adjacent sub-volumes belong to a different group, they may be partitioned into three or more groups.

Referring to FIG. 2A, the plurality of sub-volumes are divided into first and second groups 211 and 212, each having three sub-volumes. Although each of the sub-volumes in the first or second group 211 or 212 has four slices therein, each of the sub-volumes in the first or second group 211 or 212 is not limited thereto and may have at least two slices therein.

Excitation of sub-volumes having a plurality of slices therein as described above may prevent omission of image information due to an inter-slice gap between neighboring images, compared to a 2D MRI technique that excite slices having an inter-slice gap therebetween.

Referring to FIG. 2A, first, third, and fifth sub-volumes 201, 203, and 205 may be included in the first group 211 in a z-axis direction, and second, fourth, and sixth sub-volumes 202, 204, and 206 may be in the second group 212 in the z-axis direction. The MRI scanner 110 in FIG. 1 applies RF pulses and a selection gradient to the subject so that the plurality of sub-volumes, namely, the first, third, and fifth sub-volumes 201, 203, and 205, in the first group 211 are simultaneously excited. After completing reconstruction of image data for the first group 211, the MRI scanner 110 applies RF pulses and a selection gradient to the subject so that the plurality of sub-volumes, namely, the second, fourth, and sixth sub-volumes 202, 204, and 206, in the second group 212 are simultaneously excited.

More specifically, the MRI scanner 110 applies first RF pulses and a first selection gradient to the subject so that the plurality of sub-volumes, namely, the first, third, and fifth sub-volumes 201, 203, and 205, in the first group 211 are simultaneously excited. The first RF pulses may include a plurality of frequency components, i.e., first through third frequency components for exciting the first, third, and fifth sub-volumes 201, 203, and 205, respectively.

After exciting the plurality of sub-volumes, namely, the first, third, and fifth sub-volumes 201, 203, and 205, in the first group 211, the MRI scanner 110 applies second RF pulses and a second selection gradient to the subject so that the plurality of sub-volumes, namely, the second, fourth, and sixth sub-volumes 202, 204, and 206, in the second group 212 are simultaneously excited.

Referring to FIG. 2B, a plurality of sub-volumes are divided into first and second groups 221 and 222, each having four sub-volumes. First, third, fifth, and seventh sub-volumes may be included in the first group 221 in the z-axis direction, and second, fourth, sixth, and eighth sub-volumes may be included in the second group 222 in the z-axis direction. When the MRI scanner 110 applies a first encoding gradient in a first direction and a second encoding gradient in a third direction to the subject to perform 3D encoding, the first and third directions may be y- and z-axis directions, respectively.

Simultaneous excitation of the plurality of sub-volumes as described above may decrease the amount of time required to perform slice encoding in the third direction. Furthermore, the number of slice encoding steps in the third direction may be reduced proportionally to the number of sub-volumes in each group. As shown in FIG. 2B, when each of the first and second groups 221 and 222 has four sub-volumes, the number of slice encoding steps in the z-axis direction may be reduced to ¼ compared to when the plurality of sub-volumes are not grouped. Due to its reduced scan time, the MRI system 100 may create high resolution 3D full volume images at a high speed.

FIG. 3 illustrates an example of a multi-volume imaging technique for each of a plurality of groups. Referring to section 31 in FIG. 3 showing that a plurality of sub-volumes are simultaneously excited, a plurality of sub-volumes in a first group 311 are simultaneously excited, and a plurality of sub-volumes in a second group 312 are simultaneously excited. When the number of groups is n, and the number of simultaneously excited sub-volumes in each group is M, the full volume of a subject is partitioned into M×n sub-volumes to perform 3D MRI on the subject. Referring to FIG. 3, since each of the first and second groups 311 and 312 includes three sub-volumes, 3D MRI is performed on the subject that is partitioned into six sub volumes because M=3, n=2, and M×n=3×2=6. Each of the plurality of sub-volumes in each of the first and second groups 311 and 312 includes a predetermined number of slices. For example, a first slice 3211 may be a first slice in a first sub-volume, a second slice 3212 may be a first slice in a second sub-volume, and a third slice 3213 may be a first slice in a third sub-volume. In the same manner, the predetermined number of slices may be included in each of the plurality of sub-volumes.

Section 32 in FIG. 3 illustrates encoding 321 of the first group 311 in the z-axis direction and encoding 322 of the second group 312 in the z-axis direction.

It is assumed herein that frequency encoding, phase encoding, and slice encoding are performed in x-, y-, and z-axis directions, respectively. When a plurality of sub-volumes in a subject are not partitioned into a plurality of groups, and the number of slice encoding steps in the z-axis direction for the full volume of the subject is Nz, the number of slice encoding steps in the z-axis direction is Nz. However, because the MRI system 100 in FIG. 1 performs 3D MRI by dividing the whole volume into M×n sub-volumes, the number of slice encoding steps in the z-axis direction is Nz/M. The number of slice encoding steps in the z-axis direction for each of the M×n sub-volumes is Nz/(M×n). The slice encoding is performed simultaneously for the M sub-volumes in each group. Thus, the number of slice encoding steps for each of the n groups is Nz/(M×n), and the total number of slice encoding steps for all of the n groups is (Nz/(M×n))×n=Nz/M.

More specifically, when a plurality of sub-volumes in a subject are not divided into a plurality of groups, the number of phase encoding steps for the full volume in the y-axis direction is Ny, and the number of slice encoding steps for the full volume in the z-axis direction is Nz, so the total scan time TA for the full volume is Ny×Nz. However, when the MRI system 100 of FIG. 1 is used, the total scan time TA is Ny×(Nz/M)=(Ny×Nz)/M=TA/M.

The number of encoding steps and the total scan time in the above-described MRI system 100 are the minimum number of encoding steps and the minimum total scan time in the MRI system 100. However, in certain situations, it may not be possible to achieve these minimums. For example, if there are overlapping areas between the plurality of sub-volumes, the number of slice encoding steps in the z-axis direction may be greater than Nz/M, thus increasing the total scan time.

As described above, the MRI system 100 performs 3D encoding by simultaneously exciting sub-volumes, each having a plurality of slices therein, thereby reducing the number of slice encoding steps in the z-axis direction, and thus the scan time required to acquire the full volume image of the subject. Furthermore, the MRI system 100 performs 3D encoding on each sub-volume, thereby eliminating the need to perform MRI scans in a plurality of orientations to remove a gap between slices, which may be created when 2D encoding is performed on each slice.

Figure 4A:
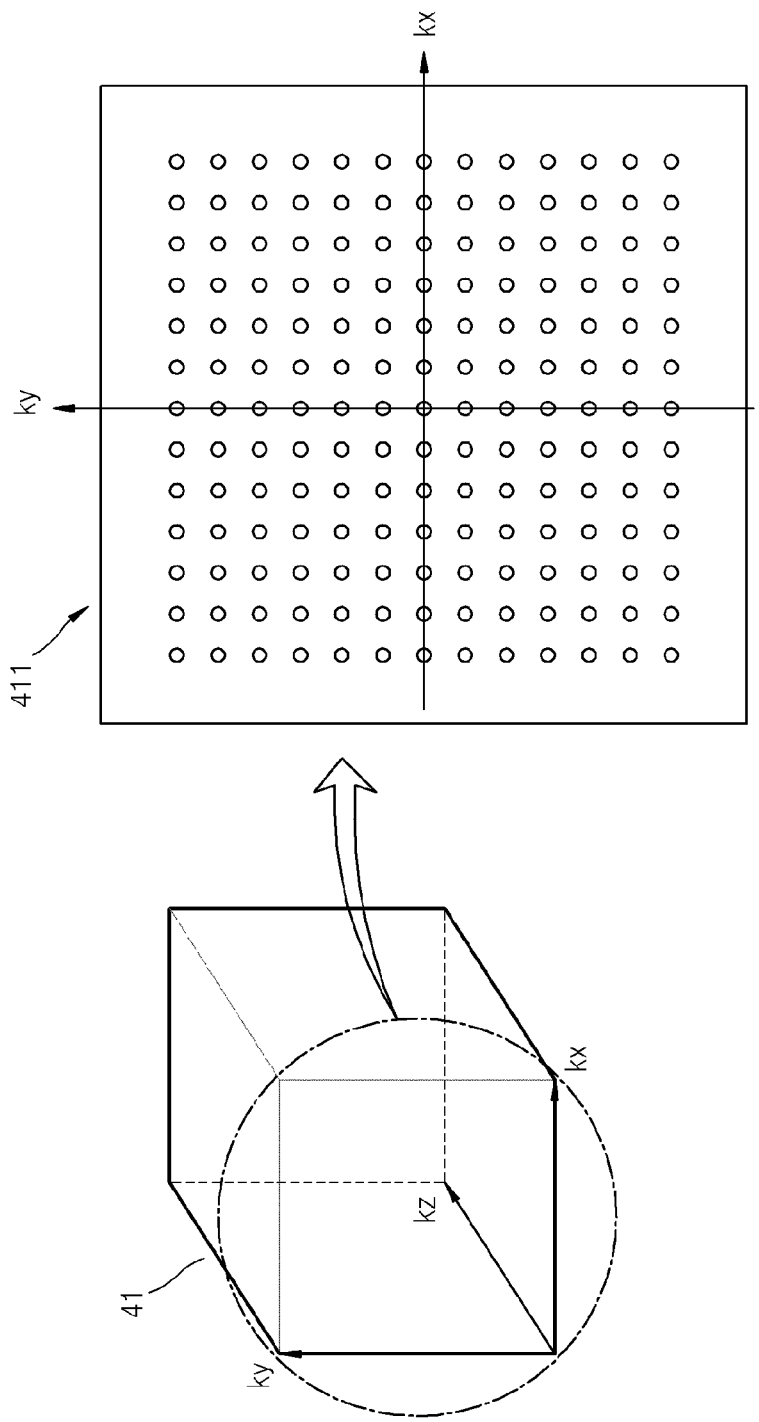
FIGS. 4A and 4B illustrate examples of k-spaces.
Figure 4B:
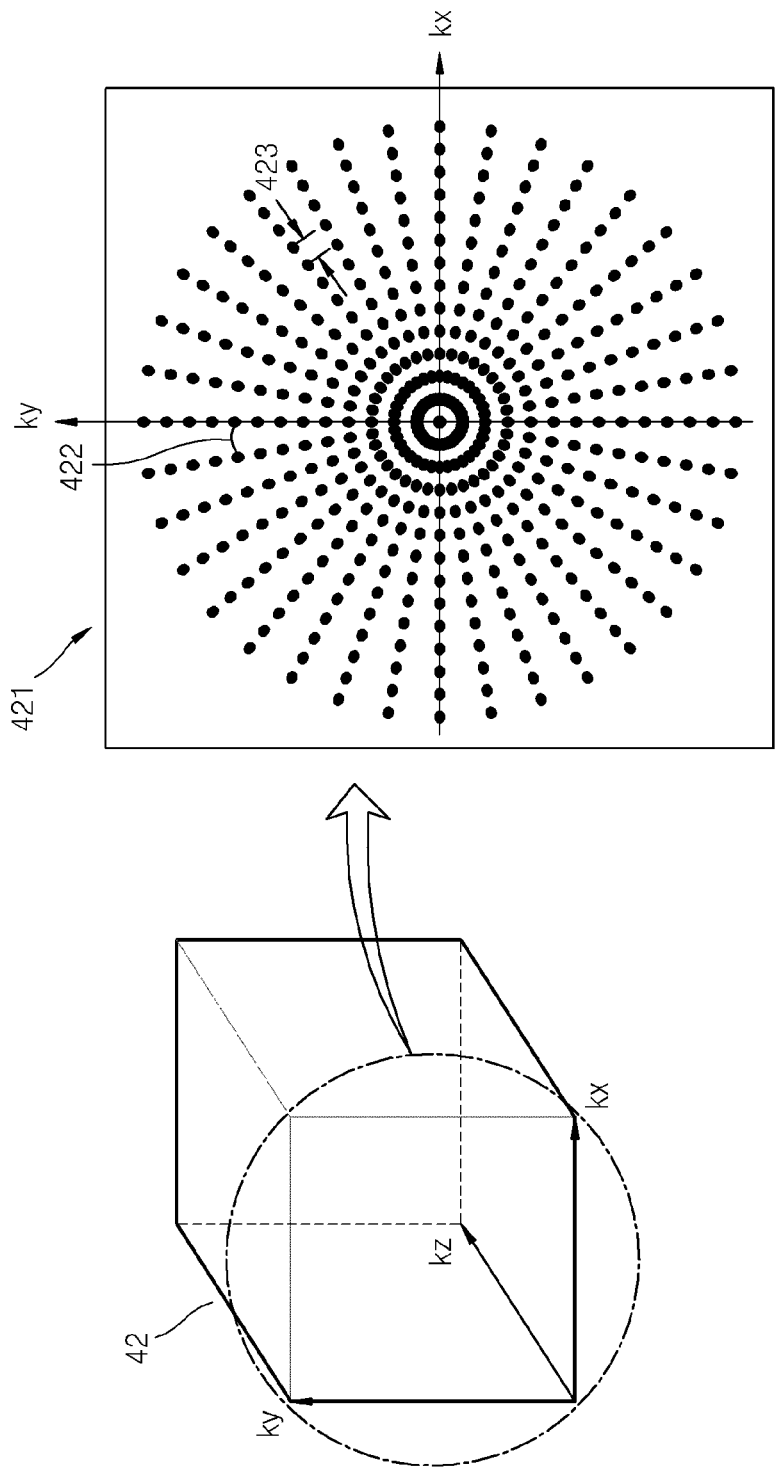

FIGS. 4A and 4B illustrate examples of k-spaces 41 and 42, respectively. Referring to FIGS. 1, 4A, and 4B, the data processor 120 uses magnetic resonance signals received from one of a plurality of multi-channel receiver coils to create the k-space 41 or 42. The one multi-channel receiver coil may be one of the current elements in the multi-channel receiver coil, but is not limited thereto.

After the MRI scanner 110 performs 3D encoding on each of a plurality of sub-volumes, the data processor 120 produces the k-space 41 or 42.

Referring to FIG. 4A, the MRI scanner 110 performs a Cartesian encoding method in x-, y-, and z-axis directions so that a plane 411 defined by x- and y-axes of the k-space 41 is filled with Cartesian data. For example, the plane 411 may be magnetic resonance signals acquired from slices at the same location in each of the plurality of sub-volumes in FIG. 3, e.g., the first through third slices 3211, 3212, and 3213.

Referring to FIG. 4B, the MRI scanner 110 performs 3D encoding using at least two encoding methods.

For example, the MRI scanner 110 performs radial encoding in x- and y-axis directions and Cartesian encoding in a z-axis direction. The x- and y-axis directions may be in-plane directions. To perform radial encoding, the MRI scanner 110 may apply a frequency encoding gradient and a first encoding gradient to the subject so that trajectories for frequency encoding in the x-axis direction and phase encoding in the y-axis direction follow a radial trajectory.

Thus, a plane 421 defined by x- and y-axes of the k-space 42 may be filled with radial data that may be obtained by an in-plane radial trajectory k-space sampling or radial projection sampling method. For example, the radial data may have a predetermined trajectory angle 422 and a predetermined sampling interval 423 that may be determined by a frequency encoding gradient applied in the x-axis direction and a first encoding gradient applied in the y-axis direction.

Furthermore, the data processor 120 performs regridding to convert the radial data filled in the plane 421 into Cartesian coordinate data, followed by a Fourier transform on the resultant data to produce image data. An interpolation may also be performed in conjunction with regridding, but the data processor 120 is not limited thereto.

As illustrated in the plane 421, the radial data that is concentrated at regions near the center of the k-space 42 has a sufficient amount of low frequency range information. More specifically, as a radial projection technique is applied in the direction in which the plane 421 is aligned, signals near DC are obtained sufficiently due to fine sampling or weighted sampling around the center of the k-space 42. Thus, since the radial data is less sensitive or resistant to motion of a subject, motion artifacts may be reduced. While FIG. 4B illustrates use of a radial encoding method for convenience of explanation, the encoding method is not limited thereto, and spiral encoding and other encoding techniques may be used instead of the radial encoding method.

Figure 5:
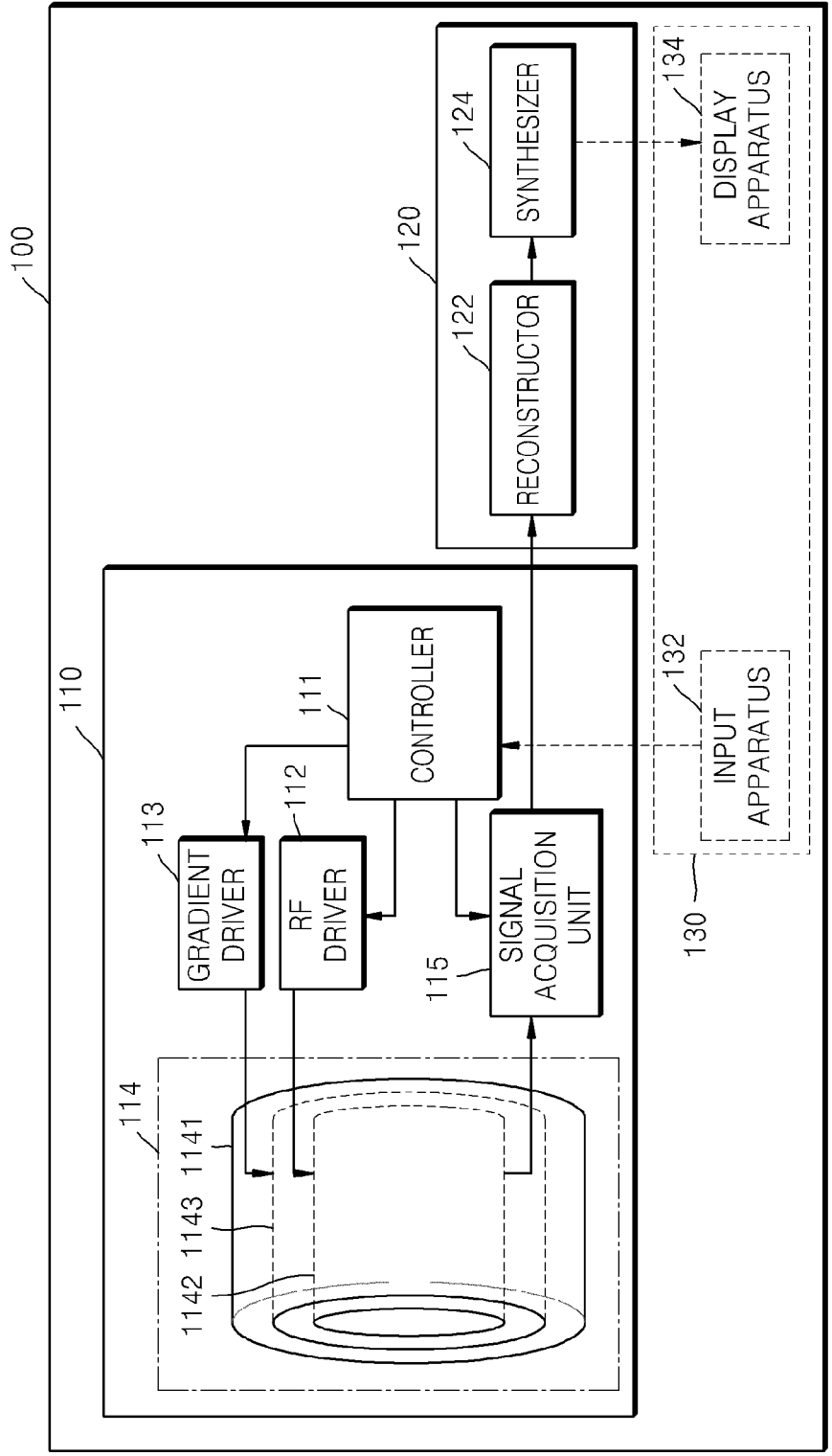
FIG. 5 illustrates another example of an MRI system.

FIG. 5 illustrates another example of an MRI system 100. Referring to FIG. 5, the MRI system 100 includes an MRI scanner 110, a data processor 120, and a user interface 130. The MRI scanner 110 includes a controller 111, an RF driver 112, a gradient driver 113, a magnet apparatus 114, and a signal acquisition unit 115. The magnet apparatus 114 includes a magnetic force generator 1141, RF coils 1142, and gradient coils 1143. The data processor 120 includes a reconstructor 122 and a synthesizer 124. The user interface 130 includes an input apparatus 132 and a display apparatus 134. The MRI system 100 of FIG. 5 is a more detailed example of the MRI system 100 of FIG. 1. Thus, the descriptions with respect to the MRI system 100 in FIG. 1 are also applicable to the MRI system 100 in FIG. 5, and thus are not repeated here.

The MRI system 100 non-invasively acquires images containing information about biological tissues of a subject. The images may be 3D volume images, but are not limited thereto. The MRI scanner 110 applies a predetermined pulse sequence to the subject to obtain magnetic resonance signals emitted by the subject.

The controller 111 controls the overall operation of the MR scanner 110. For example, the controller 111 may control the RF driver 112, the gradient driver 113, and the signal acquisition unit 115. The RF driver 112 drives the RF coils 1142, and the gradient driver 113 drives the gradient coils 1143.

The magnet apparatus 114 applies RF pulses and a gradient to the subject, and acquires magnetic resonance signals from the subject. The magnet apparatus 114 may be located within a shielded space, or may be open to the outside.

The magnetic force generator 1141 produces a magnetic force so that the subject is located in a static magnetic field.

The RF coils 1142 apply RF pulses containing a plurality of frequency components to the subject, and acquire magnetic resonance signals from the subject. The RF coils 1142 may include both RF transmitter coils and RF receiver coils, or RF transceiver coils that both transmit and receive. Hereinafter, for convenience of explanation, the RF coils 1142 are described as having the RF transmitter coils and the RF receiver coils, but are not limited thereto.

RF pulses applied to the subject by the RF transmitter coils of the RF coils 1142 may include multi-band RF pulses or spatial encoding RF pulses. The RF receiver coils of the RF coils 1142 acquire magnetic resonance signals from the subject and output the acquired magnetic resonance signals to the data processor 120. The RF receiver coils may be multi-channel receiver coils. For example, the RF receiver coils may be multi-channel receiver coils containing 32 channels, but are not limited thereto.

The gradient coils 1143 apply a selection gradient, a first encoding gradient, a second encoding gradient, and a frequency encoding gradient to a subject. For example, the gradient coils 1143 include z coils for applying the selection gradient and the second encoding gradient, x coils for applying the frequency encoding gradient, and y coils for applying the first encoding gradient.

The signal acquisition unit 115 acquires the magnetic resonance signals output from the RF coils and performs predetermined operations on the acquired magnetic resonance signals. For example, the signal acquisition unit 115 may include an amplifier for amplifying the acquired magnetic resonance signals, a demodulator for demodulating the amplified magnetic resonance signals, and an analog-to-digital converter (ADC) for converting the demodulated magnetic resonance signals into digital form. The signal acquisition unit 115 may further include a storage for storing the digital magnetic resonance signals.

The data processor 120 performs predetermined operations on the magnetic resonance signals received from the MRI scanner 110.

The reconstructor 122 reconstructs the received magnetic resonance signals into image data corresponding to each of a plurality of sub-volumes.

For a reconstruction operation, the reconstructor 122 uses the magnetic resonance signals from the MRI scanner 110 to make up a k-space and performs a Fourier transform on k-space data in the k-space. The k-space data has all image data for a plurality of sub-volumes superimposed on each other.

More specifically, multi-channel receiver coils receive magnetic resonance signals for superimposed images of an excited plurality of sub-volumes. The reconstructor 122 uses channel information of the multi-channel receiver coils to separate magnetic resonance signals for the superimposed images into image data corresponding to each of the plurality of sub-volumes.

A parallel imaging algorithm is a technique for de-aliasing or removing aliasing that is caused due to a reduction in sampling lines for signal acquisition to increase scanning speed. For example, the parallel imaging algorithm may include SENSE, which uses coil field sensitivity corresponding to channel information of each multi-channel receiver coil, and GRAPPA, which uses an auto-calibration signal (ACS) kernel to estimate a value of an unacquired signal line from acquired magnetic resonance signals for surrounding signal lines. The reconstructor 122 uses channel information of multi-channel receiver coils and de-aliasing in a parallel imaging algorithm to reconstruct the superimposed magnetic resonance signals into image data corresponding to each of the plurality of sub-volumes, as described in greater detail below with reference to FIG. 7.

The synthesizer 124 synthesizes the reconstructed image data provided by the reconstructor 122. Synthesis may mean fusion or combining. As described above, for example, when the subject consists of first and second groups, the MRI scanner 110 first applies RF pulses containing a plurality of frequency components and a selection gradient to the subject so that a plurality of sub-volumes in the first group are simultaneously excited. The MRI scanner 110 then performs 3D encoding on each of the excited plurality of sub-volumes using at least two encoding methods, and acquires magnetic resonance signals from the plurality of sub-volumes. The reconstructor 122 reconstructs the magnetic resonance signals into image data corresponding to each of the plurality of sub-volumes in the first group. Similarly, the MRI scanner 110 acquires magnetic resonance signals from a plurality of sub-volumes in the second group, and the reconstructor 122 reconstructs the magnetic resonance signals into image data corresponding to each of the plurality of sub-volumes in the second group. The synthesizer 124 combines image data corresponding to each of the plurality of sub-volumes in the first group with the image data corresponding to each of the plurality of sub-volumes in the second group to create a full volume image of the subject.

The user interface 130 obtains input information from the user and displays output information. While FIG. 5 shows that the input apparatus 132 is separated from the display apparatus 134 for convenience of explanation, the user interface 130 is not limited thereto. In other words, the input apparatus 132 and the display apparatus 134 may be integrated into a single device for operation.

The input apparatus 132 obtains input information for selecting a resolution of an MR image and a thickness of slices from the user. The display apparatus 134 displays the full volume image of the subject created by the synthesizer 124 or an image of a region of interest in the full volume image. Although the MRI system 100 includes the display apparatus 134, the display apparatus 134 may be disposed outside of the MRI system 100.

Figure 6:
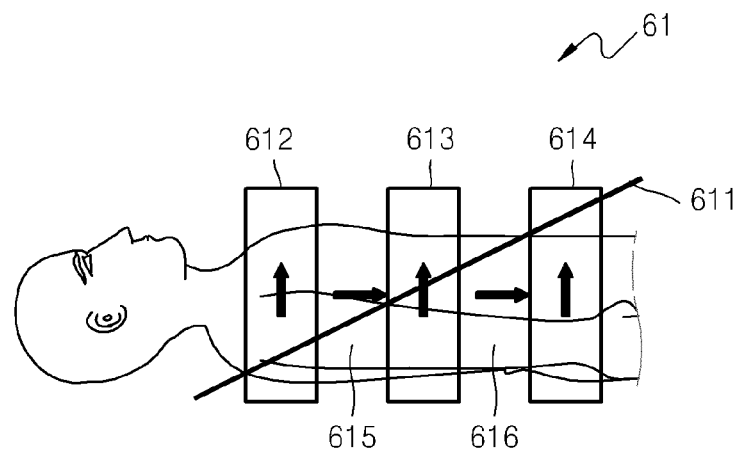
FIG. 6 illustrates an example of simultaneous excitation of a plurality of sub-volumes.

FIG. 6 illustrates an example of simultaneous excitation of a plurality of sub-volumes. According to a multi-volume imaging technique 61, upon application of a selection gradient to a subject lying in a static magnetic field, a linearly varying magnetic field gradient 611 is created in the subject so that each of a plurality of sub-volumes 612 through 616 in the subject has a different Larmor frequency.

When a first sub-volume 612, a third sub-volume 613, and a fifth sub-volume 614 are in a first group, RF pulses having a plurality of frequency components and exciting the first, third, and fifth sub-volumes 612 through 614 are applied to the subject to simultaneously excite the first, third, and fifth sub-volumes 612 through 614 in the first group. For example, the first, third, and fifth sub-volumes 612 through 614 may be excited by RF pulses having first, third, and fifth Larmor frequencies, respectively.

Figure 7:
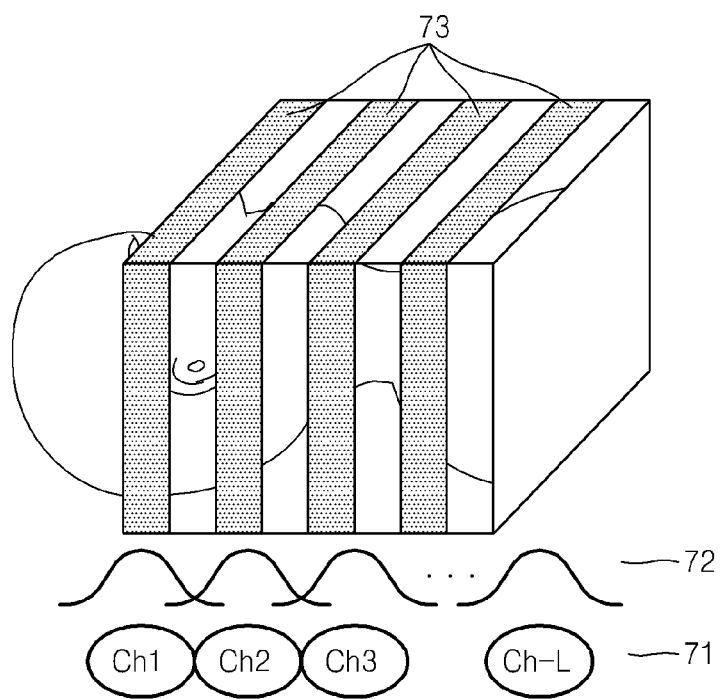
FIG. 7 illustrates an example of reconstruction of image data.

FIG. 7 illustrates an example of reconstruction of image data. Referring to FIG. 7, reference numeral 71 denotes multi-channel RF receiver coils having L channels, and 72 denotes coil field maps for each of the multi-channel RF receiver coils. The coil field maps 72 may be sensitivity profiles of the multi-channel RF receiver coils 71. When a plurality of sub-volumes in a first group 73 are simultaneously excited, the multi-channel RF receiver coils 71 acquire magnetic resonance signals from the plurality of sub-volumes in the first group 73.

When S denotes signals received from the multi-channel RF receiver coils 71 containing 32 channels, B denotes the coil field maps 72 for each of the multi-channel RF receiver coils 71, and F denotes signals representing reconstructed image data for the plurality of sub-volumes in the first group 73, the relationship between S, B, and F is given by Equations 2 and 3 below $$S=(bR)F=BF \quad (2)$$

In Equation 2, b is a sensitivity profile of each of the multi-channel RF receiver coils 71, and R is phase information about each of the plurality of sub-volumes in the first group 73 when RF pulses containing a plurality of frequency components are applied to each of the plurality of sub-volumes.

For example, first through third sub-volumes in the first group 73 may be excited by RF pulses having first through third Larmor frequencies, respectively. Similarly, the remaining sub-volumes in the first group 73 may be excited by RF pulses with different Larmor frequencies. As evident from Equation 2, B representing the coil field maps 72 may be defined by the product of the phase information R of RF pulses and the sensitivity profile b of each of the multi-channel RF receiver coils 71.

However, when the RF pulses having a plurality of frequency components have the same phase, the coil field maps 72 may be defined without considering the phase information R of the RF pulses. In this case, an identity matrix may be used as the phase information R of Equation 2.

$$\begin{bmatrix} S_0 \\ S_1 \\ S_2 \\ \vdots \\ S_{31} \end{bmatrix} = \begin{bmatrix} B_0^0 & \cdots & B_0^3 \\ B_1^0 & \cdots & B_1^3 \\ B_2^0 & \cdots & B_2^3 \\ \vdots & & \vdots \\ B_{31}^0 & \vdots & B_{31}^3 \end{bmatrix} \begin{bmatrix} f^0 \\ f_1 \\ f^2 \\ f^3 \end{bmatrix} \quad (3)$$

In Equation 3, $S_p$ denotes a signal received from a p-th channel coil of the multi-channel RF receiver coils 71, $B_p^m$ denotes a coil field map for an m-th sub-volume of the plurality of sub-volumes in the first group 73 and the p-th channel coil, and $f^m$ denotes image data for the m-th sub-volume.

Thus, the reconstructor 122 in FIG. 5 performs operations using Equation 4 below to reconstruct magnetic resonance signals received from the multi-channel RF receiver coils 71 into image data corresponding to each of the plurality of sub-volumes in the first group 73.

$$F=(B^T \cdot B)^{-1} \cdot B^T \cdot S \quad (4)$$

In Equation 4, $B^T$ denotes the transpose of the B matrix.

As described above, the reconstructor 122 uses channel information of the multi-channel receiver coils 71 and de-aliasing in a parallel imaging algorithm to reconstruct the superimposed magnetic resonance signals into image data corresponding to each of the plurality of sub-volumes.

After being received from the multi-channel RF receiver coils 71, magnetic resonance signals superimposed in a k-space may be separated using RF decoding using coil sensitivities of the multi-channel RF receiver coils 71.

Figure 8:
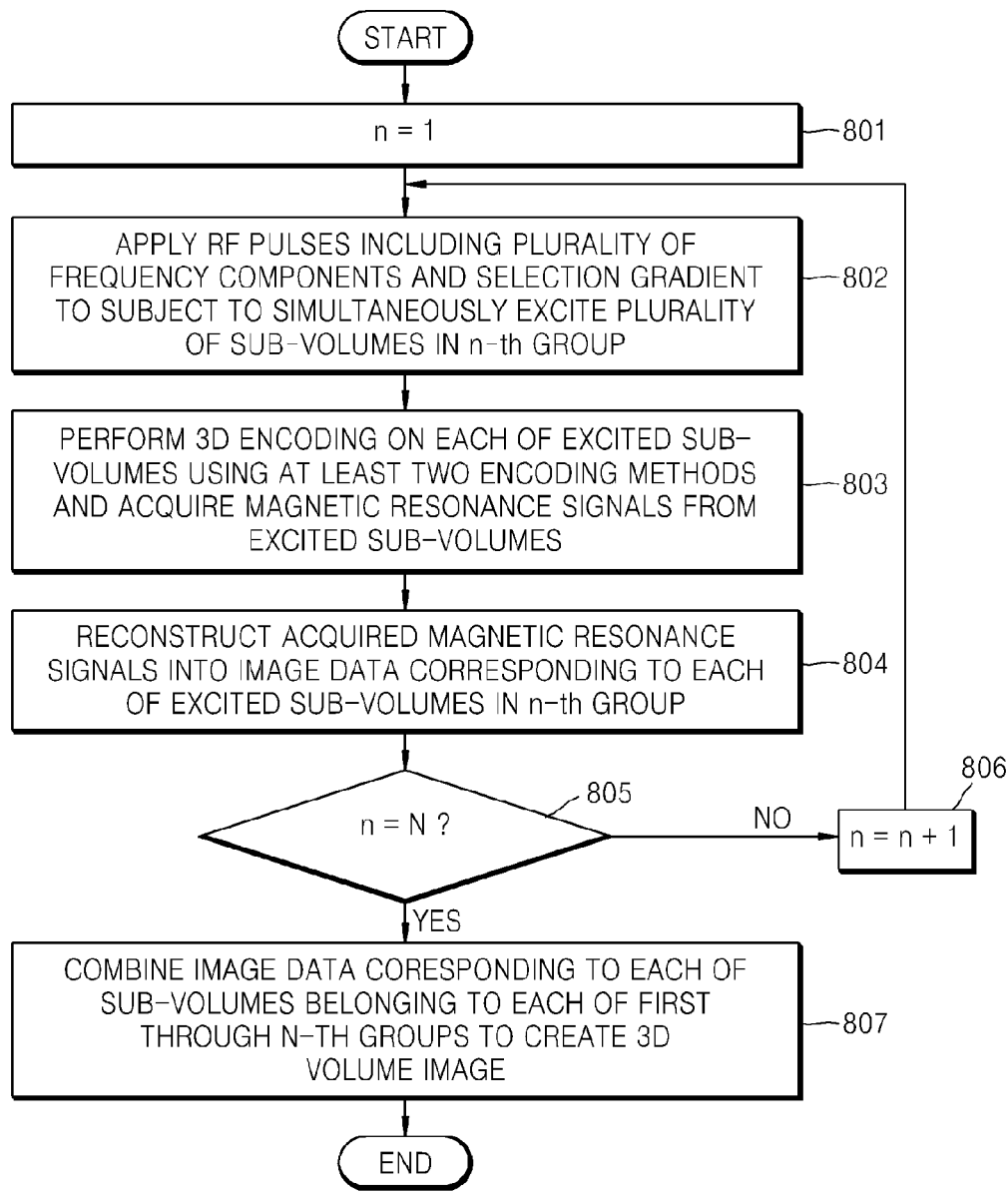
FIG. 8 is a flowchart of an example of an MRI method.
Figure 9:
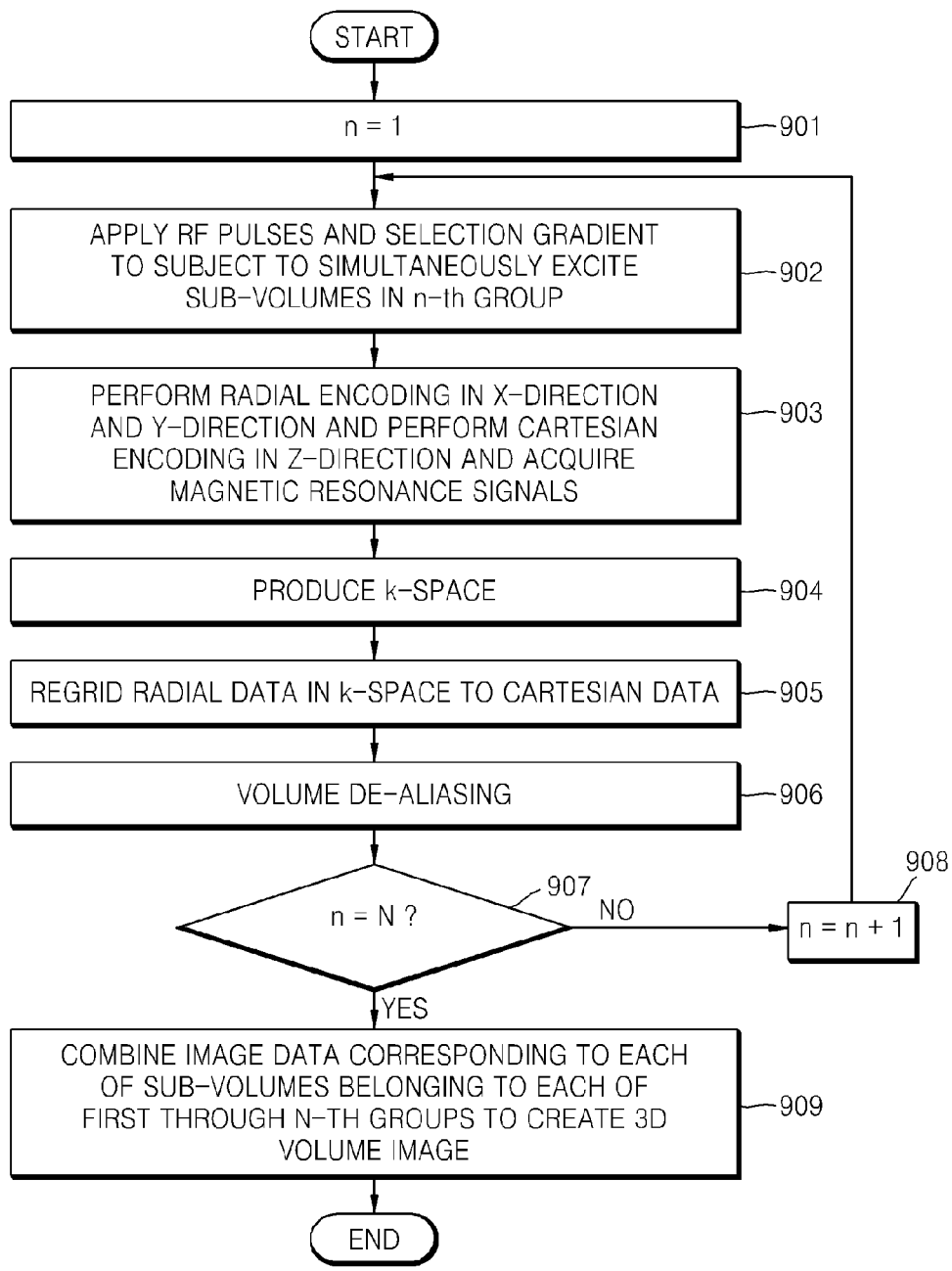
FIG. 9 is a flowchart of another example of an MRI method.

FIGS. 8 and 9 are flowcharts of examples of MRI methods. Referring to FIGS. 8 and 9, the MRI methods include operations performed in a time series in the MRI systems 100 of FIGS. 1 and 5. Thus, although hereinafter omitted, the descriptions of the MRI system 100 with respect to FIGS. 1 and 5 are also applicable to the MRI methods illustrated in FIGS. 8 and 9.

FIG. 8 is a flowchart of an example of an MRI method. Referring to FIGS. 1, 5, and 8, the controller 111 of the MRI scanner 110 sets n to 1 (operation 801)

The MRI scanner 110 applies RF pulses including a plurality of frequency components and a selection gradient to the subject to simultaneously excite sub-volumes in an n-th group, wherein a plurality of sub-volumes in a volume of a subject are divided into N groups so that any neighboring sub-volumes belong to different groups (operation 802). The RF driver 112 drives the RF coils 1142 to apply the RF pulses. The gradient driver 113 drives the gradient coils 1143 to apply the selection gradient.

The MRI scanner 110 performs 3D encoding on each of the excited sub-volumes using at least two encoding methods, and acquires magnetic resonance signals from the encoded sub-volumes (operation 803). For example, to perform the 3D encoding using the at least two encoding methods, the MRI scanner 110 may apply to the subject a first encoding gradient in a first direction, which follows a radial trajectory, a frequency encoding gradient in a second direction, which follows a radial trajectory, and a second encoding gradient in a third direction, which follows a Cartesian trajectory. One of the first and third directions may be the same direction that the selection gradient is applied in operation 801. The gradient driver 113 drives the gradient coils 1143 to apply the first encoding gradient, the frequency encoding gradient, and the second encoding gradient.

The reconstructor 122 of the data processor 120 reconstructs the magnetic resonance signals acquired in operation 803 into image data corresponding to each of the plurality of sub-volumes in the n-th group (operation 804).

The controller 111 of the MRI scanner 110 determines whether operations 802 through 804 have been performed on all N groups constituting the subject (operation 805). If operations 802 through 804 have not been performed on all N groups constituting the subject, the method proceeds to operation 806. Otherwise, if operations 802 through 804 have been performed on all N groups constituting the subject, the method proceeds to operation 807.

The controller 111 increase n by 1 and proceeds to operation 802 (operation 806).

The synthesizer 124 fuses or combines image data corresponding to each of a plurality of sub-volumes that belong to each of all N groups constituting the subject to thereby create a 3D volume image (operation 807). All N groups constituting the subject may be the first through N-th groups.

The MRI method of FIG. 8 allows creation of high resolution 3D volume images at a high speed.

FIG. 9 is a flowchart of another example of an MRI method. Referring to FIGS. 1, 5, and 9, the controller 111 of the MRI scanner 110 sets n to 1 (operation 901).

The MRI scanner 110 applies RF pulses including a plurality of frequency components and a selection gradient to the subject to simultaneously excite sub-volumes in an n-th group, wherein a plurality of sub-volumes in a volume of a subject are divided into N groups so that any neighboring sub-volumes belong to different groups (operation 902).

The MRI scanner performs radial encoding on each of the excited sub-volumes in x- and y-axis directions and Cartesian encoding in a z-axis direction, and acquires magnetic resonance signals from the sub-volumes (operation 903).

The reconstructor 122 of the data processor 120 uses the magnetic resonance signals acquired in operation 903 to produce a k-space (operation 904). A plane defined by x- and y-axes of the k-space is filled with radial data.

The reconstructor 122 then regrids the radial data in the k-space to Cartesian data (operation 905).

The reconstructor 122 performs volume de-aliasing on the resulting k-space to reconstruct image data corresponding to each of the plurality of sub-volumes in the n-th group from the k-space (operation 906). For example, the volume de-aliasing may include performing a Fourier transform on data in the k-space to produce image data corresponding to the k-space, and reconstructing the image data corresponding to the k-space into image data corresponding to each of the plurality of sub-volumes in the n-th group using coil sensitivity maps.

The controller 111 of the MRI scanner 110 determines whether operations 902 through 906 have been performed on all N groups constituting the subject (operation 907). If operations 902 through 906 have not been performed on all N groups constituting the subject, the method proceeds to operation 908. Otherwise, if operations 902 through 906 have been performed on all N groups constituting the subject, the method proceeds to operation 909.

The controller 111 increases n by 1 and proceeds to operation 902 (operation 908).

The synthesizer 124 fuses or combines image data corresponding to each of the plurality of sub-volumes that belong to each of all N groups constituting the subject to thereby create a 3D volume image (operation 909). All of the N groups constituting the subject may be the first through N-th groups.

The MRI method of FIG. 9 allows creation of high resolution 3D volume images at a high speed.

The MRI systems 100 of FIGS. 1 and 5 and the MRI methods of FIGS. 8 and 9 use a multi-volume excitation technique to simultaneously excite a plurality of sub-volumes each including a plurality of slices, perform 3D gradient encoding in x-, y-, and z-axis directions using at least two encoding methods, and reconstruct images using coil sensitivity and RF decoding.

The MRI system 100, the MRI scanner 110, and the data processor 120 in FIG. 1 and the MRI system 100, the MRI scanner 110, the controller 111, the RF driver 112, the gradient driver 113, the magnet apparatus 114, the magnetic force generator 1141, the RF coils 1142, the gradient coils 1143, the signal acquisition unit 115, the data processor 120, the reconstructor 122, the synthesizer 124, the user interface 130, the input apparatus 132, and the display apparatus 134 in FIG. 5 described above that perform the operations illustrated in FIGS. 2A, 2B, 3, 4A, 4B, and 6-9 may be implemented using one or more hardware components, one or more software components, or a combination of one or more hardware components and one or more software components.

A hardware component may be, for example, a physical device that physically performs one or more operations, but is not limited thereto. Examples of hardware components include resistors, capacitors, inductors, power supplies, frequency generators, operational amplifiers, power amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the detailed description.

What is claimed is:

1. A magnetic resonance imaging (MRI) method comprising:
    simultaneously exciting a first plurality of sub-volumes of a subject, the excited first sub-volumes being separated from one another by second sub-volumes of the subject that are not excited at a same time as the excited first sub-volumes, the second sub-volumes being excited at one or more other times from the first excited sub-volumes;
    performing three-dimensional (3D) encoding on each of the excited first sub-volumes using a plurality of encoding methods;
    acquiring magnetic resonance image signals from the encoded first sub-volumes; and
    reconstructing the acquired magnetic resonance signals into image data corresponding to each of the encoded first sub-volumes.

2. The method of claim 1, further comprising performing a repeating of the exciting, encoding, acquiring, and reconstructing on another plurality of sub-volumes of the subject selected from the second sub-volumes until the performing the exciting, encoding, acquiring, and reconstructing have been performed on all of the sub-volumes of the subject.

3. The method of claim 1, wherein the encoding methods comprise a plurality of encoding methods having different trajectories in different respective dimensions.

4. The method of claim 1, wherein the encoding methods comprise a plurality of encoding methods having different sensitivities to a motion of the subject.

5. The method of claim 1, wherein the encoding methods comprise a plurality of encoding methods producing k-space data having a plurality of different distributions.

6. A magnetic resonance imaging (MRI) method comprising:
applying radio-frequency (RF) pulses comprising a plurality of frequency components and a selection gradient to a subject to simultaneously excite a plurality of sub-volumes in each of a plurality of groups, wherein a plurality of sub-volumes making up a volume of the subject are divided into the plurality of groups so that any neighboring sub-volumes belong to different groups;
performing three-dimensional (3D) encoding on each of the excited sub-volumes using a plurality of encoding methods;
acquiring magnetic resonance signals from the encoded sub-volumes; and
reconstructing the acquired magnetic resonance signals into image data corresponding to each of the encoded sub-volumes.

7. The method of claim 6, wherein the performing of the 3D encoding comprises:
performing a first encoding method in a first direction and a second direction on each of the excited sub-volumes; and
performing a second encoding method in a third direction on each of the excited sub-volumes.

8. The method of claim 7, wherein the first encoding method comprises radial encoding or spiral encoding; and
the second encoding method comprises Cartesian encoding.

9. The method of claim 6, wherein the plurality of groups comprise a first group through an N-th group, the plurality of sub-volumes making up the volume of the subject are sequentially and cyclically distributed to the first group through the N-th group, and N is an integer greater than or equal to 2.

10. The method of claim 6, wherein the reconstructing of the acquired magnetic resonance signals comprises reconstructing the acquired magnetic resonance signals into the image data corresponding to each of the encoded sub-volumes using a parallel imaging algorithm that takes into consideration channel information of multi-channel receiver coils configured to acquire the magnetic resonance signals.

11. The method of claim 6, further comprising performing the applying of the RF pulses and the selection gradient to the subject, the performing of the 3D encoding on each of the excited sub-volumes, the acquiring of the magnetic resonance signals from the encoded sub-volumes, and the reconstructing of the acquired magnetic resonance signals into image data for all of the plurality of groups to obtain reconstructed image data for all of the plurality of groups; and
synthesizing the reconstructed image data for all of the plurality of groups.

12. A non-transitory computer-readable storage medium storing a program for controlling a computer to perform the method of claim 6.

13. The method of claim 6, wherein the different groups are excited at different times, and
the 3D encoding includes simultaneously encoding in three directions on each of the excited sub-volumes using respectively different encoding methods.

14. The method of claim 6, wherein the different groups are excited at different times, and
wherein the 3D encoding includes simultaneously encoding of each of the excited sub-volumes for each group in direction that crosses at least two sub-volumes.

15. A magnetic resonance imaging (MRI) system comprising:
an MRI scanner configured to:
apply radio-frequency (RF) pulses comprising a plurality of frequency components and a selection gradient to a subject to simultaneously excite a plurality of sub-volumes in each of a plurality of groups, wherein a plurality of sub-volumes making up a volume of the subject are divided into the plurality of groups so that any neighboring sub-volumes belong to different groups;
perform three-dimensional (3D) encoding on each of the excited sub-volumes using a plurality of encoding methods; and
acquire magnetic resonance signals from the encoded sub-volumes; and
a data processor configured to reconstruct the acquired magnetic resonance signals into image data corresponding to each of the encoded sub-volumes
wherein the plurality of groups comprise a first group through an N-th group, the plurality of sub-volumes making up the volume of the subject are sequentially and cyclically distributed to the first group through the N-th group, and N is an integer greater than or equal to 2.

16. The system of claim 15, wherein the MRI scanner is further configured to perform the 3D encoding by:
performing a first encoding method in a first direction and a second direction on each of the excited sub-volumes; and
performing a second encoding method in a third direction on each of the excited sub-volumes.

17. The system of claim 16, wherein the first encoding method comprises radial encoding or spiral encoding; and
the second encoding method comprises Cartesian encoding.

18. The system of claim 15, wherein the plurality of groups comprise a first group through an N-th group, the plurality of sub-volumes making up the volume of the subject are sequentially and cyclically distributed to the first group through the N-th group, and N is an integer greater than or equal to 2.

19. The system of claim 15, wherein the MRI scanner comprises gradient coils configured to apply the selection gradient to the subject and perform the 3D encoding on each of the excited sub-volumes by applying to the subject:
a first encoding gradient in a first direction for performing phase encoding with a radial trajectory or a spiral trajectory;
a frequency encoding gradient in a second direction for performing frequency encoding with the radial trajectory or the spiral trajectory; and
a second encoding gradient in a third direction for performing slice encoding with a Cartesian trajectory; and
the third direction is a same direction as a direction in which the selection gradient is applied.

20. The system of claim 15, wherein the MRI scanner comprises RF coils configured to acquire the magnetic resonance signals from the encoded sub-volumes;
the data processor comprises a reconstructor configured to produce k-spaces from the magnetic resonance signals acquired by the RF coils, and reconstruct image data generated from the k-spaces into image data corresponding to each of the encoded sub-volumes; and each of the k-spaces comprises radial data filling a plane defined by a first direction and a second direction of each of the k-spaces.

21. The system of claim 15, wherein the MRI scanner comprises multi-channel receiver coils configured to acquire the magnetic resonance signals from the encoded sub-volumes; and the data processor is further configured to reconstruct the acquired magnetic resonance signals into the image data corresponding to each of the encoded sub-volumes using a parallel imaging algorithm that takes into consideration channel information of the multi-channel receiver coils.

22. The system of claim 15, wherein the data processor comprises:

a reconstructor configured to reconstruct the acquired magnetic resonance signals into image data corresponding to each of the plurality of sub-volumes in each of the plurality of groups to obtain reconstructed image data for all of the plurality of groups; and a synthesizer configured to synthesize the reconstructed image data for all of the plurality of groups.

* * * * *